(12) United States Patent

Morita et al.

(10) Patent No.: US 7,973,180 B2
(45) Date of Patent: Jul. 5, 2011

(54) PROCESS FOR PRODUCING AQUEOUS DISPERSION OF COMPOSITE OF POLY(3,4-DIALKOXYTHIOPHENE) WITH POLYANION

(75) Inventors: Yoshiyuki Morita, Hyogo (JP); Yasuo Chikusa, Hyogo (JP); Kyoko Miyanishi, Hyogo (JP); Stephan Kirchmeyer, Leverkusen (DE); Wilfried Loevenich, Bergisch-Gladbach (DE)

(73) Assignee: H.C. Starck GmbH (DE)

( * ) Notice: Subject to any disclaimer, the term of this patent is extended or adjusted under 35 U.S.C. 154(b) by 0 days.

(21) Appl. No.: 12/093,623

(22) PCT Filed: Oct. 6, 2006

(86) PCT No.: PCT/JP2006/320432
§ 371 (c)(1),
(2), (4) Date: Jun. 25, 2008

(87) PCT Pub. No.: WO2007/058036
PCT Pub. Date: May 24, 2007

(65) Prior Publication Data
US 2009/0030149 A1    Jan. 29, 2009

(30) Foreign Application Priority Data
Nov. 17, 2005  (JP) .................... 2005-332831

(51) Int. Cl.
*C08G 61/12* (2006.01)
*C08L 25/18* (2006.01)
*C08L 65/00* (2006.01)

(52) U.S. Cl. ............... 549/50; 549/53; 549/54; 549/62; 549/66; 549/67

(58) Field of Classification Search .................... 549/50, 549/53, 54, 62, 66, 67
See application file for complete search history.

(56) References Cited

U.S. PATENT DOCUMENTS

| 5,300,575 A | 4/1994 | Jonas et al. |
| 5,370,825 A | 12/1994 | Angelopoulos et al. |
| 2004/0097741 A1* | 5/2004 | Groenendaal et al. ........ 549/50 |
| 2004/0102577 A1* | 5/2004 | Hsu et al. ........................ 525/182 |
| 2004/0152832 A1* | 8/2004 | Kirchmeyer et al. ........ 524/800 |
| 2006/0020092 A1* | 1/2006 | Chikusa et al. ................ 526/256 |
| 2006/0180797 A1 | 8/2006 | Merker et al. |

FOREIGN PATENT DOCUMENTS

| JP | 6-287454 | 10/1994 |
| JP | 7-90060 | 4/1995 |
| JP | 8-48858 | 2/1996 |
| JP | 2636968 | 4/1997 |
| JP | 2000153229 | 6/2000 |
| JP | 2004-59666 | 2/2004 |
| JP | 2006-28214 | 2/2006 |
| WO | WO-2004/029128 A2 | 4/2004 |
| WO | WO-2004/088672 A1 | 10/2004 |

* cited by examiner

*Primary Examiner* — Kelechi C Egwim
(74) *Attorney, Agent, or Firm* — Connolly Bove Lodge & Hutz LLP

(57) ABSTRACT

The present invention provides a method for the production of an aqueous dispersion containing an electroconductive polymer component which enables electroconductive thin films which are outstanding in their transparency and electroconductivity to be formed, together with the aqueous dispersion obtained by said method. This method includes a stage in which a 3,4-dialkoxythiophene is polymerized in an aqueous solvent using an oxidizing agent in the presence of a polyanion and, in this stage, said oxidizing agent is added by the dropwise addition of a solution or dispersion containing said oxidizing agent to the reaction solution or, alternatively, in the polymerization stage, the alkali metal ion concentration in the reaction liquid is maintained at no more than 400 ppm.

13 Claims, No Drawings

PROCESS FOR PRODUCING AQUEOUS DISPERSION OF COMPOSITE OF POLY(3,4-DIALKOXYTHIOPHENE) WITH POLYANION

TECHNICAL FIELD

The present invention relates to a method for the production of an aqueous dispersion of a complex of a poly(3,4-dialkoxythiophene) and a polyanion; and to the aqueous dispersion obtained by said method.

PRIOR-ART

Transparent electroconductive films are used as transparent electrodes for liquid crystal displays, electroluminescent displays, plasma displays, electrochromic displays, solar cells, touch panels and the like, and they are also employed for the coating of electromagnetic wave shielding materials and other substrates. The most widely utilized transparent electroconductive film is a vapour-deposited film of an indium-tin complex oxide (ITO) but this has problems in that a high temperature is required for the film formation and, moreover, the film-forming cost is high. ITO films based on film-forming coating methods also require high temperatures for film formation, and their electroconductivity is governed by the dispersion of the ITO. Furthermore, their haze value is not very low. In addition, inorganic oxide films like ITO tend to crack along with flexure of the substrate, with the result that a lowering in the electroconductivity readily occurs.

Moreover, the indium which is a starting material for ITO is a scarce metal and, in recent years, demand for transparent electroconductive films has been increasing so, currently, raw material costs are rising sharply.

In contrast, the use of electroconductive polymers which can undergo film formation at low temperatures and low cost has been proposed for the production of transparent electroconductive films comprising an organic material. For example, in JP2636968 there is described a method for the production of a complex of a poly(3,4-dialkoxythiophene) and a polyanion, which has excellent water dispersion properties. The thin film formed by applying a coating composition containing this aqueous dispersion onto a substrate is adequate in terms of its antistatic performance but is inadequate in terms of transparency and electroconductivity.

In JP-A-8-48858 there is described the fact that, by adding a compound containing a group selected from dihydroxy, polyhydroxy, amide and lactam groups to the aqueous dispersion of the complex of poly(3,4-dialkoxythiophene) and polyanion described in aforesaid JP2636968, it is possible to enhance the electroconductivity of the thin film which is formed on a substrate using the coating composition obtained. Furthermore, according to JP-A-2000-153229, an enhancement in the electroconductivity of the thin film is obtained when a coating composition which contains both the aqueous dispersion of a complex of a poly(3,4-dialkoxythiophene) and a polyanion described in aforesaid JP2636968, together with an aprotic compound of dielectric constant $\in \geq 15$, is applied to the substrate and then dried at a temperature of less than 100° C.

In the coating compositions in each of these publications, the properties are enhanced and the electroconductivity comparatively improved by adding a specified compound to the aqueous dispersion of the complex of a poly(3,4-dialkoxythiophene) and a polyanion described in aforesaid JP2636968. However, the aqueous dispersion containing the electroconductive polymer employed is itself the same, so the transparency and the electroconductivity of the aqueous dispersion obtained are not really adequate.

In JP-A-2004-59666 there is disclosed the fact that an aqueous dispersion containing a complex from which a thin film with outstanding transparency and electroconductivity can be formed may be obtained by using peroxodisulphuric acid as the oxidizing agent, or by adding an acid to lower the pH at the time of the polymerization, when performing the polymerization of the 3,4-dialkoxythiophene in the presence of a polyanion. By such means a thin film with comparatively outstanding transparency and electroconductivity may be formed but there is a demand for the development of both a material and a production method for obtaining thin films of still more outstanding transparency and electroconductivity.

DISCLOSURE OF THE INVENTION

The present invention aims to solve the problems associated with the prior art described above and its objectives are both to provide a method for producing an aqueous dispersion containing an electroconductive polymer component from which electroconductive thin films with outstanding transparency and electroconductivity can be produced, and also to provide an aqueous dispersion obtained by said method.

In order to achieve this, the present inventors carried out extensive investigations into the polymerization conditions at the time of the polymerization of the 3,4-dialkoxythiophene using an oxidizing agent in the presence of the polyanion and, as a result, they have perfected the present invention.

A first method for the production of an aqueous dispersion of a complex of a poly(3,4-dialkoxy thiophene) and a polyanion according to the present invention includes a stage in which a 3,4-dialkoxythiophene represented by the following formula (1)

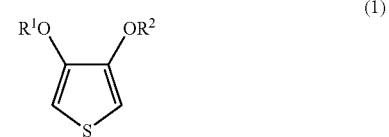

(where $R^1$ and $R^2$ are either mutually independently hydrogen or a $C_{1-4}$ alkyl group or, together, form a $C_{1-4}$ alkylene group where said alkylene group is optionally substituted) is subjected to polymerization using an oxidizing agent in an aqueous medium in the presence of a polyanion, and in this polymerization stage said oxidizing agent is added to the reaction liquid by the dropwise addition of a solution or dispersion containing said oxidizing agent.

A second method for the production of an aqueous dispersion of a complex of a poly(3,4-dialkoxythiophene) and a polyanion according to the present invention includes a stage in which a 3,4-dialkoxythiophene represented by the following formula (1)

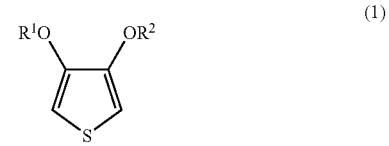

(where $R^1$ and $R^2$ are either mutually independently hydrogen or a $C_{1-4}$ alkyl group or, together, form a $C_{1-4}$ alkylene group where said alkylene group is optionally substituted) is subjected to polymerization using an oxidizing agent in an aqueous medium in the presence of a polyanion, and in this polymerization stage the alkali metal ion concentration in the reaction liquid is maintained at no more than 400 ppm.

A third method for the production of an aqueous dispersion of a complex of a poly(3,4-dialkoxythiophene) and a polyanion according to the present invention includes a stage in which a 3,4-dialkoxythiophene represented by the following formula (1)

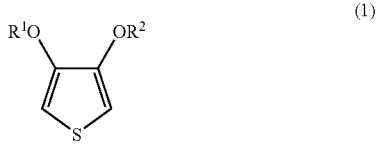

(where $R^1$ and $R^2$ are either mutually independently hydrogen or a $C_{1-4}$ alkyl group or, together, form a $C_{1-4}$ alkylene group where said alkylene group is optionally substituted) is subjected to polymerization using an oxidizing agent in an aqueous medium in the presence of a polyanion, and said oxidizing agent is added to the reaction liquid by the dropwise addition of a solution or dispersion containing said oxidizing agent and, furthermore, in this polymerization stage the alkali metal ion concentration in the reaction liquid is maintained at no more than 400 ppm.

The present invention also encompasses the aqueous dispersions of the complex of poly(3,4-dialkoxythiophene) and polyanion obtained by these aforesaid methods.

An aqueous dispersion of a complex of a poly(3,4-dialkoxythiophene) and a polyanion is readily produced by the methods of the present invention. By using this aqueous dispersion, it is possible to form a thin film on a substrate readily by a wet process under low-temperature conditions. The thin film obtained possesses flexibility and, furthermore, it is excellent in terms of its transparency and electroconductivity.

Optimum Mode for Practising the Invention

The methods of the present invention for producing an aqueous dispersion of a complex of a poly(3,4-dialkoxythiophene) and a polyanion include a stage in which a 3,4-dialkoxythiophene represented by the following formula (1)

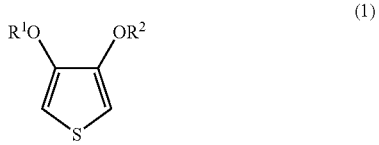

(where $R^1$ and $R^2$ are either mutually independently hydrogen or a $C_{1-4}$ alkyl group or, together, they form a $C_{1-4}$ alkylene group where said alkylene group is optionally substituted) is subjected to polymerization in an aqueous solvent using an oxidizing agent in the presence of a polyanion.

In the first inventive method the aforesaid oxidizing agent is added by means of the dropwise addition of a solution or dispersion containing said oxidizing agent to the reaction liquid (below, said solution or dispersion containing the oxidizing agent is sometimes just referred to as the liquid containing the oxidizing agent). In the second method, the alkali metal ion concentration in the reaction liquid in the polymerization stage is maintained at no more than 400 ppm. In the third method, the aforesaid oxidizing agent is added by means of the dropwise addition of a solution or dispersion containing said oxidizing agent to the reaction liquid and, furthermore, the alkali metal ion concentration in the reaction liquid in the polymerization stage is maintained at no more than 400 ppm.

Below, these methods are explained in turn.

(I) First Method

In the 3,4-dialkoxythiophene represented by aforesaid formula (1) used in the first method, preferred examples of the $C_{1-4}$ alkyl groups which constitute $R^1$ and $R^2$ are the methyl group, ethyl group and n-propyl group. Examples of the $C_{1-4}$ alkylene groups formed from $R^1$ and $R^2$ together are 1,2-alkylene and 1,3-alkylene groups, preferred examples of which are the methylene group, 1,2-ethylene group and 1,3-propylene group. Of these, the 1,2-ethylene group is particularly preferred. Furthermore, the $C_{1-4}$ alkylene group may also be substituted, examples of the substituent groups being $C_{1-12}$ alkyl groups and the phenyl group, etc. Examples of the substituted $C_{1-4}$ alkylene groups are the 1,2-cyclohexylene and 2,3-butylene groups. As representative examples of such alkylene groups, the 1,2-alkylene groups substituted with $C_{1-12}$ alkyl groups formed from both $R^1$ and $R^2$ may be derived from 1,2-dibromoalkanes obtained by the bromination of α-olefins such as ethene, propene, hexene, octene decene, dodecene, styrene and the like.

In the aforesaid method, the polymerization reaction is carried out in the presence of a polyanion as stated above. Examples of compounds from which the polyanion can be formed (below, sometimes just referred to as the polyanion compound) are polyacrylic acid, poly-methacrylic acid, polymaleic acid and other such polycarboxylic acids; and polystyrenesulphonic acid, polyvinylsulphonic acid and other such polysulphonic acids. Of these, polystyrenesulphonic acid is particularly preferred. The molecular weight of the polyanion compound is not particularly restricted but, normally, the weight average molecular weight lies in the range from 1,000 to 2,000,000, preferably in the range from 2,000 to 1,000,000 and more preferably in the range from 10,000 to 500,000. Polystyrenesulphonic acid of molecular weight within the aforesaid range is especially preferred. The percentage sulphonation of the polystyrenesulphonic acid is not particularly restricted but, preferably, it lies within the range from 80 to 100%, and more preferably from 85 to 95%. Here the "percentage sulphonation" refers to the proportion (%) of styrene units with a sulphonic acid group in terms of the total of styrene units either with or without a sulphonic acid group in the molecule.

The amount of the aforesaid polyanion compound used is preferably from 50 to 3,000 parts by mass, more preferably from 100 to 1,000 parts by mass, and in particular from 150 to 500 parts by mass, per 100 parts by mass of the aforesaid 3,4-dialkoxythiophene.

While there is no restriction thereto, the following compounds may be given as examples of the oxidizing agent employed in the first method; namely, peroxodisulphuric acid, sodium peroxodisulphate, potassium peroxodisulphate, ammonium peroxodisulphate, inorganic oxidizing ferric salts, organic oxidizing ferric salts, hydrogen peroxide, potassium permanganate, potassium dichromate, alkali perborates, copper salts and the like. Of these, peroxodisulphuric acid, sodium peroxodisulphate, potassium peroxodisulphate and ammonium peroxodisulphate are particularly preferred. Again, as an oxidation catalyst, there may be optionally added a catalytic amount of a compound which can form transition metal ions (such as iron, cobalt, nickel, molybdenum or vanadium ions, etc.). The amount of the aforesaid oxidizing agent employed preferably lies in the range from 1 to 5 equivalents, and more preferably from 2 to 4 equivalents, per mol of the aforesaid thiophene.

In the first method, the solvent employed is an aqueous solvent, and water is particularly preferred. There may also be used an alcohol such as methanol, ethanol, 2-propanol or 1-propanol, or a water-soluble solvent such as acetone or acetonitrile to which water is added.

In accordance with the first method, in producing the aqueous dispersion of the complex of a poly(3,4-dialkoxythiophene) and a polyanion, a solution or dispersion containing the aforesaid oxidizing agent (the liquid containing the oxidizing agent) is added dropwise to a mixture containing the aforesaid 3,4-dialkoxythiophene and polyanion in an aforesaid solvent. Here, reference to "a solution or dispersion containing the oxidizing agent is added dropwise" means that the liquid containing the oxidizing agent is added a little at a time, either intermittently or continuously, and it includes for example the mode whereby the liquid containing said oxidizing agent is injected a minute amount at a time, continuously, into the reaction liquid.

As the solvent employed in the liquid containing the oxidizing agent, there will be used an aqueous solvent identical to that above, preferably water. The oxidizing agent concentration, the dropwise addition rate and the time required for the dropwise addition will be suitably determined in accordance with the particular conditions, such as the type and amount of oxidizing agent added, the type and amount of the poly(3,4-dialkoxythiophene) and polyanion compound, and the amount of reaction liquid, etc. Normally, the time over which the dropwise addition is performed will be at least one minute, preferably from 5 minutes to 30 hours, and still more preferably from 30 minutes to 18 hours.

It is preferred that the pH of the reaction liquid at the time of the aforesaid polymerization be comparatively low, and a pH of no more than 1.5 is desirable. Optionally, the pH of the reaction liquid may be adjusted by the addition of acid. In the case of the dropwise addition of an aqueous solution of peroxodisulphuric acid for example, the pH of the reaction liquid falls along with said dropwise addition and, normally, at the completion of the dropwise addition the pH is $\leq 1.5$, so this is preferred.

The acid which can be added at the time of the polymerization is an acid selected from the group comprising water-soluble inorganic and organic acids.

Examples of the inorganic acids are hydrochloric acid, sulphuric, acid, nitric acid, phosphoric acid, perchloric acid and the like. Examples of the organic acids are p-toluenesulphonic acid, benzenesulphonic acid, methanesulphonic acid, trifluoromethanesulphonic acid and the like.

In the first method, the temperature of the liquid reaction mixture at the time of the polymerization is between 0 and 100° C. From the point of view of suppressing side reaction, from 0 to 50° C. is preferred and from 0 to 30° C. is particularly preferred.

In the first method, the time over which the polymerization reaction is conducted is appropriately determined by the type and amount of added oxidizing agent, the rate of dropwise addition of the liquid containing the oxidizing agent, the polymerization temperature and the pH of the reaction liquid, etc. The reaction time will be, for example, between 5 and 100 hours, but normally it is between 10 and 40 hours.

In the first method, the alkali metal ion concentration in the reaction liquid is not particularly restricted.

By adding the aforesaid liquid containing the oxidizing agent by means of dropwise addition, the concentration of the oxidizing agent in the reaction liquid gradually increases. As a result, the reaction can be made to progress smoothly and it is possible to suppress side reaction. By such a method, the complex of the poly(3,4-dialkoxythiophene) and polyanion can be made homogeneous, with a narrow molecular weight distribution.

(II) Second Method

The 3,4-dialkoxythiophene used in the second method is the same as the 3,4-dialkoxythiophene employed in the aforesaid first method. Moreover, as the polyanion or polyanion compound, there can be employed that used in the first method above.

In the second method, the concentration of alkali metal ions in the reaction liquid at the time of the polymerization of the 3,4-dialkoxythiophene in the presence of the polyanion using an oxidizing agent is maintained at no more than 400 ppm. The alkali metal ion concentration is preferably maintained at no more than 300 ppm and still more preferably at no more than 200 ppm. Hence, it is desirable, for example, that the aforesaid oxidizing agent does not contain alkali metal ions. Alternatively, it is desirable either that the liquid containing the oxidizing agent does not contain alkali metal ions or that the alkali metal ion concentration is low.

The following compounds may be given as examples of oxidizing agents which do not contain alkali metal ions but there is no restriction to these particular examples; peroxodisulphuric acid, ammonium peroxodisulphate, ferric salts of inorganic acids, ferric salts of organic acids, hydrogen peroxide, copper salts and the like. Of these, examples of the ferric salts of inorganic acids include ferric sulphate, ferric chloride and ferric nitrate, and examples of the ferric salts of organic acids include ferric citrate, iron(III) ammonium citrate, ferric p-toluenesulphonate, ferric diisopropylnaphthalene-sulphonate and the like. Examples of the copper salts are copper(I) oxide, copper(II) oxide, copper(I) chloride, copper(II) chloride, copper(I) bromide, copper(II) bromide, copper(II) acetate, copper(II) acetylacetonate, basic copper(II) carbonate and copper(II) sulphate. Of these, the peroxodisulphuric acid and ammonium peroxodisulphate are particularly preferred.

Amongst the aforesaid oxidizing agents, the peroxodisulphuric acid is itself an extremely unstable compound and when left on its own or in aqueous solution it gradually decomposes. Hence, for example, the peroxodisulphuric acid may be produced just prior to its use by subjecting a solution of a peroxodisulphate salt (such as sodium peroxodisulphate salt) to an ion-exchange reaction based on a cation exchange resin. By suitably adjusting the degree of ion-exchange at this time, there may be obtained a solution of oxidizing agent in which the concentration of the counter ions (such as sodium ions) derived from the original peroxodisulphate salt is adjusted to a desired value.

There may also be optionally added to the aforesaid oxidizing agent a catalytic amount of a compound which can form transition metal ions (such as, for example, iron, cobalt, nickel, molybdenum or vanadium ions), as an oxidation catalyst. The amount of the aforesaid oxidizing agent used is preferably from 1 to 5 equivalents, and more preferably from 2 to 4 equivalents, per mol of the aforesaid thiophene.

In the second method, the solvent employed is identical to the solvent used in the aforesaid first method. The preferred pH at the time of the polymerization is the same as in the first method above, and the pH can be adjusted by means of acid in the same way as in the first method above. With regard to the temperature of the reaction mixture at the time of polymerization, and time employed, etc., these are the same as in the first method above.

In this second method, the oxidizing agent addition method is not particularly restricted. It may be added all in one go to the reaction system or it may be added slowly. Moreover, the liquid containing the oxidizing agent may also be added dropwise in the same way as in the aforesaid first method.

By keeping the alkali metal ion concentration in the reaction liquid to a low level in accordance with this method, it is possible to prevent alkali metal ions from coupling to the polyanions, so side reaction is suppressed and the reaction can be carried out more efficiently. By this method, the complex of poly(3,4-dialkoxythiophene) and polyanion produced can be made homogeneous, with a narrow molecular weight distribution.

(III) Third Method

The 3,4-dialkoxythiophene used in the third method is the same as the 3,4-dialkoxythiophene employed in the aforesaid first method. Furthermore, as the polyanion (the polyanion compound) and the oxidizing agent, there can be employed those used in the first method above.

In this third method, in the same way as in the first method above the aforesaid liquid containing the oxidizing agent is added dropwise to the mixture containing the 3,4-dialkoxythiophene and polyanion in a solvent. Furthermore, in the same way as in the second method above, the concentration of the alkali metal ions in the reaction liquid at the time of polymerization is maintained at no more than 400 ppm.

The solvent used in the reaction, the mode of dropwise addition of the liquid containing the oxidizing agent and the means for maintaining the pH of the reaction liquid at no more than 400 ppm are the same as in the aforesaid first and second methods above. Again, the various conditions such as the ideal pH at the time of the reaction, the use of acid for adjusting the pH, the reaction temperature and the reaction time, are the same as in the aforesaid first and second methods.

In the inventive third method, the concentration of oxidizing agent in the reaction liquid also gradually rises in the same way as in the first method. In this way, the reaction can be made to progress smoothly and side reaction can be suppressed. Moreover, by keeping the alkali metal ion concentration at a low level, it is possible to prevent coupling of the alkali metal ions to the polyanions, so side reaction is inhibited and the reaction can be carried out more efficiently. As a result, the complex produced can be made homogeneous, with a narrow molecular weight distribution.

Poly(3,4-dialkoxythiophene) is produced in each case by means of the polymerization reactions in the first to the third methods above. This poly(3,4-dialkoxythiophene) may be regarded as being in a state doped with polyanions, and in this specification this is either described as a "complex of a poly (3,4-dialkoxythiophene) and a polyanion" or merely as the "complex".

The aqueous dispersion of the aforesaid complex is used to form a thin film on a substrate. The complex contained in the aqueous dispersions obtained by the aforesaid methods has outstanding properties as stated above. Hence, the thin film obtained on the substrate surface has transparency and electroconductivity properties which are markedly enhanced when compared to the thin films based on conventional polythiophene electroconductive polymers. In particular, a thin film obtained using the aqueous dispersion containing a complex obtained by the aforesaid third method is extremely outstanding in its transparency and electroconductivity. Moreover, since such thin films possess flexibility, they have wide-ranging applications.

EXAMPLES

Below, the present invention is explained in more specific terms based on examples and comparative examples but the invention is not to be restricted to the examples provided. In the examples and comparative examples below, 'parts' denotes 'parts by mass'.

1. Materials Employed

In the examples and comparative examples, Lewatit S100H, produced by Bayer, was employed as the cation-exchange resin, and Lewatit MP62, produced by Bayer, was employed as the anion-exchange resin, in the ion-exchange treatments of the aqueous dispersion of the complex of the poly(3,4-dialkoxythiophene) and polyanion.

2. Purification of the Polystyrenesulphonic Acid

In the purification of the polystyrenesulphonic acid employed in the examples and comparative examples, an ultrafiltration membrane (Biomax-100, produced by the Millipore Co.) was used for the ultrafiltration. Following the elimination of the low molecular weight material by ultrafiltration, a cation-exchange treatment was carried out using a column packed with Lewatit S100H.

3. Measurement of the Alkali Metal Ion Concentration

An atomic absorption method (AA-6600F, produced by Shimadzu Ltd) was employed in the measurement of the alkali metal ion concentration in the reaction liquids in the examples and comparative examples.

4. Preparation of the Aqueous Peroxodisulphuric Acid Solution

The aqueous peroxodisulphuric acid solution in the examples and comparative examples was prepared by subjecting an aqueous solution of sodium peroxodisulphate to an ion-exchange treatment using a cation exchange resin (Lewatit S100H produced by Bayer; referred to below as S100H).

5. Application of the Coating Agent and Drying Method

A glass plate (JIS R3202) was employed as the substrate. The coating agent obtained in the examples and comparative examples was diluted to a solids concentration of 0.90%, and then coating performed using a wire bar [No. 8 (to give a dry film thickness of 0.11 µm)], after which the coated film was dried by blowing air for 3 minutes at 100° C., to obtain a coated substrate having a thin film.

6. Evaluation of the Thin Film on the Substrate Surface 6.1 The surface resistivity was measured in accordance with JIS K6911 using a "Mitsubishi Chemical (Co.) Loresta GP (MCP-T600).

6.2 The total light transmittance and the haze value were measured in accordance with JIS K7150 using a Haze Computer HGM-2B manufactured by the Suga Test Instruments Co. The total light transmittance of the untreated glass plate (JIS R-3202) was 90.6% and its haze value was 0.1%.

Example 1.1

Nippon NSC (Co.) polystyrenesulphonic acid 9×401 was subjected to ultrafiltration using Biomax-100 manufactured by the Millipore Co., after which cation-exchange was carried out and, by dilution with desalted water, 1,887 parts of an aqueous solution containing 24.7 parts of polystyrenesulphonic acid (weight average molecular weight 253,000; percentage sulphonation 90%) obtained. 49 parts of a 1% aqueous iron(III) sulphate solution, 30 parts of concentrated nitric acid and 8.8 parts of 3,4-ethylenedioxythiophene were added to this aqueous solution and stirring performed and then, while maintaining the temperature within the reaction system at 10° C., 121 parts of 10.9% aqueous peroxodisulphuric acid solution (obtained by mixing a 15% aqueous sodium peroxodisulphate solution with 1.2 times the mass of S100H, and then filtering) was added dropwise over 6 hours. The sodium ion concentration in the reaction liquid after the addition of the aqueous peroxodisulphuric acid solution was 430 ppm. Following the end of the dropwise addition, stirring was carried out for 23 hours at 10° C. Next, 154 parts of cation exchange resin and 232 parts of anion exchange resin were added to this reaction liquid and, after stirring for 2 hours, the ion-exchange resins were filtered off and an aqueous dispersion of a complex of poly(3,4-ethylenedioxythiophene) and polystyrenesulphonic acid obtained (2,033 parts: solids concentration 1.30%).

Example 1.2

Nippon NSC (Co.) polystyrenesulphonic acid 9×401 was subjected to ultrafiltration using Biomax-100 manufactured by the Millipore Co., after which cation-exchange was carried out and, by dilution with desalted water, 1,887 parts of an aqueous solution containing 24.7 parts of polystyrenesulphonic acid (weight average molecular weight 253,000; percentage sulphonation 90%) obtained. 49 parts of a 1% aqueous iron(III) sulphate solution, 30 parts of concentrated nitric acid and 8.8 parts of 3,4-ethylenedioxythiophene were added to this aqueous solution and stirring performed and then, while maintaining the temperature within the reaction system at 10° C., 121 parts of 10.9% aqueous peroxodisulphuric acid solution (obtained by passing 15% aqueous sodium peroxodisulphate solution through a column packed with 4.0 times the mass of S100H) was added dropwise over 18 hours. The sodium ion concentration in the reaction liquid after the addition of the aqueous peroxodisulphuric acid solution was 1 ppm. Following the end of the dropwise addition, stirring was carried out for 11 hours at 10° C. Next, 154 parts of cation exchange resin and 232 parts of anion exchange resin were added to the reaction liquid and, after stirring for 2 hours, the ion-exchange resins were filtered off and an aqueous dispersion of a complex of poly(3,4-ethylene-dioxythiophene) and polystyrenesulphonic acid obtained (2,033 parts: solids concentration 1.30%).

Example 1.3

Nippon NSC (Co.) Versa-TL125 was subjected to ultrafiltration using Biomax-100 manufactured by the Millipore Co., after which cation-exchange was carried out and, by dilution with desalted water, 1,887 parts of an aqueous solution containing 24.7 parts of polystyrenesulphonic acid (weight average molecular weight 125,000; percentage sulphonation 100%) obtained. 49 parts of a 1% aqueous iron(III) sulphate solution, 30 parts of concentrated nitric acid and 8.8 parts of 3,4-ethylenedioxythiophene were added to this aqueous solution and stirring performed, and then 121 parts of 10.9% aqueous peroxodisulphuric acid solution (obtained by passing 15% aqueous sodium peroxodisulphate solution through a column packed with 2.0 times the mass of S100H) was added all in one go and stirring carried out. The sodium ion concentration in the reaction liquid after the addition of the aqueous peroxodisulphuric acid solution was 13 ppm and no other alkali metal ions were detected. Stirring was carried out for 17 hours while maintaining the temperature within the reaction system at 18° C. Next, 154 parts of cation exchange resin and 232 parts of anion exchange resin were added to this reaction liquid and, after stirring for 2 hours, the ion-exchange resins were filtered off and an aqueous dispersion of a complex of poly(3,4-ethylenedioxythiophene) and polystyrene-sulphonic acid obtained (2,033 parts: solids concentration 1.30%).

Example 1.4

Nippon NSC (Co.) Versa-TL125 was subjected to ultrafiltration using Biomax-100 manufactured by the Millipore Co., after which cation-exchange was carried out and, by dilution with desalted water, 1,887 parts of an aqueous solution containing 24.7 parts of polystyrenesulphonic acid (weight average molecular weight 125,000; percentage sulphonation 100%) obtained. 49 parts of a 1% aqueous iron(III) sulphate solution, 30 parts of concentrated nitric acid and 8.8 parts of 3,4-ethylenedioxythiophene were added to this aqueous solution and stirring performed and then, while maintaining the temperature in the reaction system at 18° C., 121 parts of 10.9% aqueous peroxodisulphuric acid solution (obtained by passing 15% aqueous sodium peroxodisulphate solution through a column packed with 1.2 times the mass of S100H) was added dropwise over 6 hours. The sodium ion concentration in the reaction liquid after the addition of the aqueous peroxodisulphuric acid solution was 169 ppm and no other alkali metal ions were detected. Following the end of the dropwise addition, stirring was carried out for 17 hours at 18° C. Next, 154 parts of cation exchange resin and 232 parts of anion exchange resin were added to this reaction liquid and, after stirring for 2 hours, the ion-exchange resins were filtered off, and an aqueous dispersion of a complex of poly(3,4-ethylenedioxythiophene) and polystyrenesulphonic acid obtained (2,033 parts: solids concentration 1.30%).

Comparative Example 1.1

Nippon NSC (Co.) polystyrenesulphonic acid 9×401 was subjected to ultrafiltration using Biomax-100 manufactured by the Millipore Co., after which cation-exchange was carried out and, by dilution with desalted water, 1,887 parts of an aqueous solution containing 24.7 parts of polystyrenesulphonic acid (weight average molecular weight 253,000; percentage sulphonation 90%) obtained. 49 parts of a 1% aqueous iron(III) sulphate solution, 30 parts of concentrated nitric acid and 8.8 parts of 3,4-ethylenedioxythiophene were added to this aqueous solution and, furthermore, there was also added, all in one go, 121 parts of 10.9% aqueous peroxodisulphuric acid solution (obtained by mixing 15% aqueous sodium peroxodisulphate solution with 0.7 times the mass of S100H, and then filtering), after which stirring was carried out. The sodium ion concentration in the reaction liquid was 802 ppm and no other alkali metal ions were detected. Stirring was carried out for 29 hours while maintaining the reaction system at 10° C. Next, 154 parts of cation exchange resin and 232 parts of anion exchange resin were added to the reaction liquid and, after stirring for 2 hours, the ion-exchange resins were filtered off and an aqueous dispersion of a complex of poly(3,4-ethylene-dioxythiophene) and polystyrenesulphonic acid obtained (2,033 parts: solids concentration 1.30%).

Comparative Example 1.2

Nippon NSC (Co.) Versa-TL125 was subjected to ultrafiltration using Biomax-100 manufactured by the Millipore Co., after which cation-exchange was carried out and, by dilution with desalted water, 1,887 parts of an aqueous solution containing 24.7 parts of polystyrenesulphonic acid (weight average molecular weight 125,000; percentage sulphonation 100%) obtained. 49 parts of a 1% aqueous iron(III) sulphate solution, 30 parts of concentrated nitric acid and 8.8 parts of 3,4-ethylenedioxythiophene were added to this aqueous solution and, furthermore, there was also added, all in one go, 121 parts of 10.9% aqueous peroxodisulphuric acid solution (obtained by mixing 15% aqueous sodium peroxodisulphate solution with 1.2 times the mass of S100H, and then filtering), after which stirring was carried out. The sodium ion concentration in the reaction liquid was 448 ppm and no other alkali metal ions were detected. Stirring was carried out for 23 hours while maintaining the temperature within the reaction system at 18° C. Next, 154 parts of cation exchange resin and 232 parts of anion exchange resin were added to the reaction liquid and, after stirring for 2 hours, the ion-exchange resins were filtered off and an aqueous dispersion of a complex of poly(3,4-ethylenedioxythiophene) and polystyrenesulphonic acid obtained (2,033 parts: solids concentration 1.30%).

Example 2.1

25 parts of denatured ethanol and 25 parts of desalted water were added to 100 parts of the aqueous dispersion of the complex obtained in Example 1.1, then stirring carried out for 10 minutes and 150 parts of coating agent obtained. The coating agent obtained was applied onto the glass plate in an amount such as to give a dry film thickness of 0.11 μm, after which drying was performed and a thin-film-coated substrate obtained. The total light transmittance, haze value and surface resistivity of the thin film on the surface of the substrate obtained were measured. The results are shown in Table 1. The results obtained in the following Examples 2.2 to 2.4, and Comparative Examples 1.1 to 1.2, are also shown in Table 1.

Examples 2.2 to 2.4

150 parts of coating agents were obtained in the same way as in Example 2.1 except that there were employed the aqueous dispersions obtained in Examples 1.2 to 1.4 respectively, instead of the aqueous dispersion obtained in Example 1.1. Using the coating agents, thin films were formed in the same way as in Example 2.1 and the same measurements carried out.

Comparative Examples 2.1 and 2.2

150 parts of coating agents were obtained in the same way as in Example 2.1 except that there were employed the aqueous dispersions obtained in Comparative Examples 1.1 and 1.2 respectively, instead of the aqueous dispersion obtained in Example 1. Using the coating agents, thin films were formed in the same way as in Example 2.1 and the same measurements carried out.

obtained by carrying out the polymerization reaction with the oxidizing agent solution added dropwise has a low value when compared to that of the thin films derived from an aqueous dispersion of a complex obtained by adding the oxidizing agent all in one go. Thus, it is clear that when there is used an aqueous dispersion obtained by adding the oxidizing agent solution by dropwise addition, a thin film with high electroconductivity can be obtained.

Furthermore, in the case of total light transmittance and haze value too, the latter (Examples 2.1, 2.2 and 2.4) exhibit a higher value of total light transmittance and a lower value of haze. Consequently, it is clear that when there is used an aqueous dispersion obtained by the aforesaid method, a thin film can be obtained which is outstanding in its transparency and electroconductivity.

When the results in Comparative Examples 2.1 and 2.2 are contrasted with those in Example 2.3 in Table 1, it can be seen that the surface resistivity of a thin film derived from an aqueous dispersion of a complex obtained when the alkali metal ion concentration in the reaction liquid is no more than 400 ppm has a low value when compared to that of a thin film derived from an aqueous dispersion of a complex obtained when the alkali metal ion concentration in the reaction liquid exceeds 400 ppm. Thus, in the case where there is used an aqueous dispersion obtained in such a way, it is possible to prepare a thin film of higher electroconductivity the lower the alkali metal ion concentration in the reaction liquid.

Moreover, in terms of the total light transmittance and haze value, the latter (Example 2.3) also exhibits a higher value of total light transmittance and a lower haze value so it is clear that, by this method, there can be obtained a thin film of excellent transparency and electroconductivity.

INDUSTRIAL UTILIZATION POTENTIAL

Aqueous dispersions of a complex of a poly(3,4-dialkoxythiophene) and a polyanion are readily produced by means of the methods of the present invention. The aqueous dispersions of the complex thereby obtained are ideal for use in the formation of thin films on various types of substrate. The thin films thereby obtained are outstanding in their transparency and electroconductivity, so are ideal for use as transparent electrodes such as the surface electrodes of electrolumines-

TABLE 1

| | Addition of Oxidizing Agent | Concentration of Sodium Ions in the Reaction Liquid (ppm) | Total Light Transmittance (%) | Haze Value (%) | Surface Resistivity Ω/□ |
|---|---|---|---|---|---|
| Example 2.1 | dropwise addition | 430 | 87.0 | 0.3 | 15,700 |
| Example 2.2 | dropwise addition | 1 | 87.0 | 0.1 | 12,800 |
| Example 2.3 | all in one go | 13 | 87.9 | 0.2 | 16,400 |
| Example 2.4 | dropwise addition | 169 | 87.5 | 0.3 | 15,500 |
| Comp. Ex. 2.1 | all in one go | 802 | 85.2 | 0.5 | 23,700 |
| Comp. Ex. 2.2 | all in one go | 448 | 85.7 | 0.5 | 20,000 |

Comp. Ex. = Comparative Example

When the results in Comparative Examples 2.1 and 2.2 are compared with those in Examples 2.1, 2.2 and 2.4 in Table 1, it can be seen that the surface resistivity of the thin films derived from an aqueous dispersion containing a complex cent panels, the pixel electrodes of liquid crystal displays, capacitor electrodes, the transparent electrodes of touch panels, the transparent electrodes of membrane switches and the transparent electrodes of electronic paper, etc., or for use in electromagnetic shielding of CRT displays, the electromagnetic wave shields for noise cutting in liquid crystal displays and pachinko units, or for the electrodes for light-modulating glass or organic TFTs, etc. Since the thin films obtained are flexible, they are of particular value as transparent electroconductive films for plastic film.

The invention claimed is:

1. A method for the production of an aqueous dispersion of a complex of a poly(3,4-dialkoxythiophene) and a polyanion, which includes a stage in which a 3,4-dialkoxythiophene represented by the following formula (1)

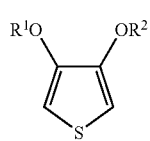
(1)

(where $R^1$ and $R^2$ are mutually independently hydrogen or a $C_{1-4}$ alkyl group or, together, form a $C_{1-4}$ alkylene group where said alkylene group is optionally substituted) is subjected to polymerization using an oxidizing agent in an aqueous medium in the presence of a polyanion, and
in this polymerization stage said oxidizing agent is added by the dropwise addition, to the reaction liquid, of a solution or dispersion containing said oxidizing agent.

2. A method for the production of an aqueous dispersion of a complex of a poly(3,4-dialkoxythiophene) and a polyanion, which includes a stage in which a 3,4-dialkoxythiophene represented by the following formula (1)

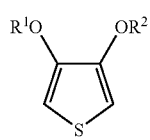
(1)

(where $R^1$ and $R^2$ are mutually independently hydrogen or a $C_{1-4}$ alkyl group or, together, form a $C_{1-4}$ alkylene group where said alkylene group is optionally substituted) is subjected to polymerization using an oxidizing agent in an aqueous medium in the presence of a polyanion, and
said oxidizing agent is added, to the reaction liquid, by the dropwise addition of a solution or dispersion containing said oxidizing agent and, furthermore, in this polymerization stage the alkali metal ion concentration in the reaction liquid is maintained at no more than 400 ppm.

3. An aqueous dispersion of a complex of a poly(3,4-dialkoxythiophene) and a polyanion obtained by the method described in claim 1.

4. An aqueous dispersion of a complex of a poly(3,4-dialkoxythiophene) and a polyanion obtained by the method described in claim 2.

5. The method as claimed in claim 1, wherein the polyanion is polyacrylic acid, poly-methacrylic acid, polymaleic acid, polycarboxylic acid, polystyrenesulphonic acid, or polyvinylsulphonic acid.

6. The method as claimed in claim 2, wherein the polyanion is polyacrylic acid, poly-methacrylic acid, polymaleic acid, polycarboxylic acid, polystyrenesulphonic acid, or polyvinylsulphonic acid.

7. The method as claimed in claim 1, wherein the polyanion is polystyrenesulphonic acid.

8. The method as claimed in claim 2, wherein the polyanion is polystyrenesulphonic acid.

9. The method as claimed in claim 1, wherein the oxidizing agent is peroxodisulphuric acid, sodium peroxodisulphate, potassium peroxodisulphate, ammonium peroxodisulphate, inorganic oxidizing ferric salts, organic oxidizing ferric salts, hydrogen peroxide, potassium permanganate, potassium dichromate, alkali perborates or copper salts.

10. The method as claimed in claim 2, wherein the oxidizing agent is peroxodisulphuric acid, sodium peroxodisulphate, potassium peroxodisulphate, ammonium peroxodisulphate, inorganic oxidizing ferric salts, organic oxidizing ferric salts, hydrogen peroxide, potassium permanganate, potassium dichromate, alkali perborates or copper salts.

11. The method as claimed in claim 7, wherein the oxidizing agent is peroxodisulphuric acid, sodium peroxodisulphate, potassium peroxodisulphate or ammonium peroxodisulphate.

12. The method as claimed in claim 8, wherein the oxidizing agent is peroxodisulphuric acid, sodium peroxodisulphate, potassium peroxodisulphate or ammonium peroxodisulphate.

13. The method as claimed in claim 1, wherein the oxidizing agent is used in the range from 2 to 4 equivalents, per mol of the aforesaid thiophene.

* * * * *